(12) United States Patent
Wu

(10) Patent No.: US 6,293,819 B1
(45) Date of Patent: Sep. 25, 2001

(54) BATTERY STAGE MODULE

(75) Inventor: Ja Fong Wu, Taipei (TW)

(73) Assignee: Silitek Corporation, Taipei (TW)

(*) Notice: Subject to any disclaimer, the term of this patent is extended or adjusted under 35 U.S.C. 154(b) by 0 days.

(21) Appl. No.: 09/562,636

(22) Filed: May 2, 2000

(51) Int. Cl.[7] .................................................. H01R 3/00
(52) U.S. Cl. ........................ 439/500; 439/698; 429/100
(58) Field of Search ................................. 439/500, 698; 429/100

(56) References Cited

U.S. PATENT DOCUMENTS 5,863,674 * 1/1999 Yamanaka ............................ 439/500

* cited by examiner

Primary Examiner—Brian Sircus
Assistant Examiner—Javaid Nasri
(74) Attorney, Agent, or Firm—Rosenberg, Klein & Lee

(57) ABSTRACT

A battery stage module comprises a battery stage with a battery chamber and two conductive members. A plurality of screws are locked to the jumper contacts of a circuit board and clamps the battery stage module to the circuit board. Each conductive member comprises at least one first spring and a second spring wherein the first spring is in contact with poles of battery and the second spring is located on bottom of the battery stage and is penetrated by the screw. The second spring is forced to touch the jumper contacts of the circuit board when the battery stage module is fixed on the circuit board by screws.

6 Claims, 6 Drawing Sheets

BATTERY STAGE MODULE

FIELD OF THE INVENTION

The present invention relates to a battery stage module, especially to a battery stage module, which has simple structure and easy assembling.

BACKGROUND IF THE INVENTION

The conventional consumer electronic devices using battery as primary or auxiliary power source generally has battery stage 10 arranged on a case 1 thereof and having a battery chamber 100, as shown in FIG. 1. The battery chamber 100 has two conductive members 101 in metal spring or tongue forms on both sides thereof and connected to positive and negative poles of battery. As shown in FIG. 2, the conductive members 101 are fixed to corresponding contacts 20 on a circuit board 2 to provide connection between the battery and the circuit board 2.

The battery stage 10 is generally integrally formed on the case 1 and the conductive members 101 are soldered to the contacts 20 on the circuit board 2 or connected to the contacts 20 through wiring in advance. The conductive members 101 pass through corresponding through holes 102 on both sides of the battery chamber 100 and are clamped by the through holes 102 when the circuit board 2 is assembled to the case 1. The soldering and wiring task for the conductive members 101 are cumbersome and the conductive members 101 cannot be firmly assembled to the case 1. Therefore, the cost is increased and the yield is reduced.

It is the object of the invention to provide a battery stage module, which has simple structure and easy assembling.

In one aspect of the invention, two conductive elements contacting the poles of the battery is assembled on a battery stage in advance to form a battery stage module. The conductive elements are also in contact with contacts on a circuit board when the battery stage module is assembled to the circuit board.

In another of the invention, each conductive element comprises a first spring and a second spring formed by bending a metal wire. The first spring is assembled to two lengthwise ends of a battery chamber to touch the poles of the battery. The second spring is arranged beside the jumper contacts of the circuit board. The second spring is in contact with the jumper contacts of the circuit board by a clamping means.

The various objects and advantages of the present invention will be more readily understood from the following detailed description when read in conjunction with the appended drawing, in which:

DETAILED DESCRIPTION OF THE PREFERRED EMBODIMENT

Figure 1:
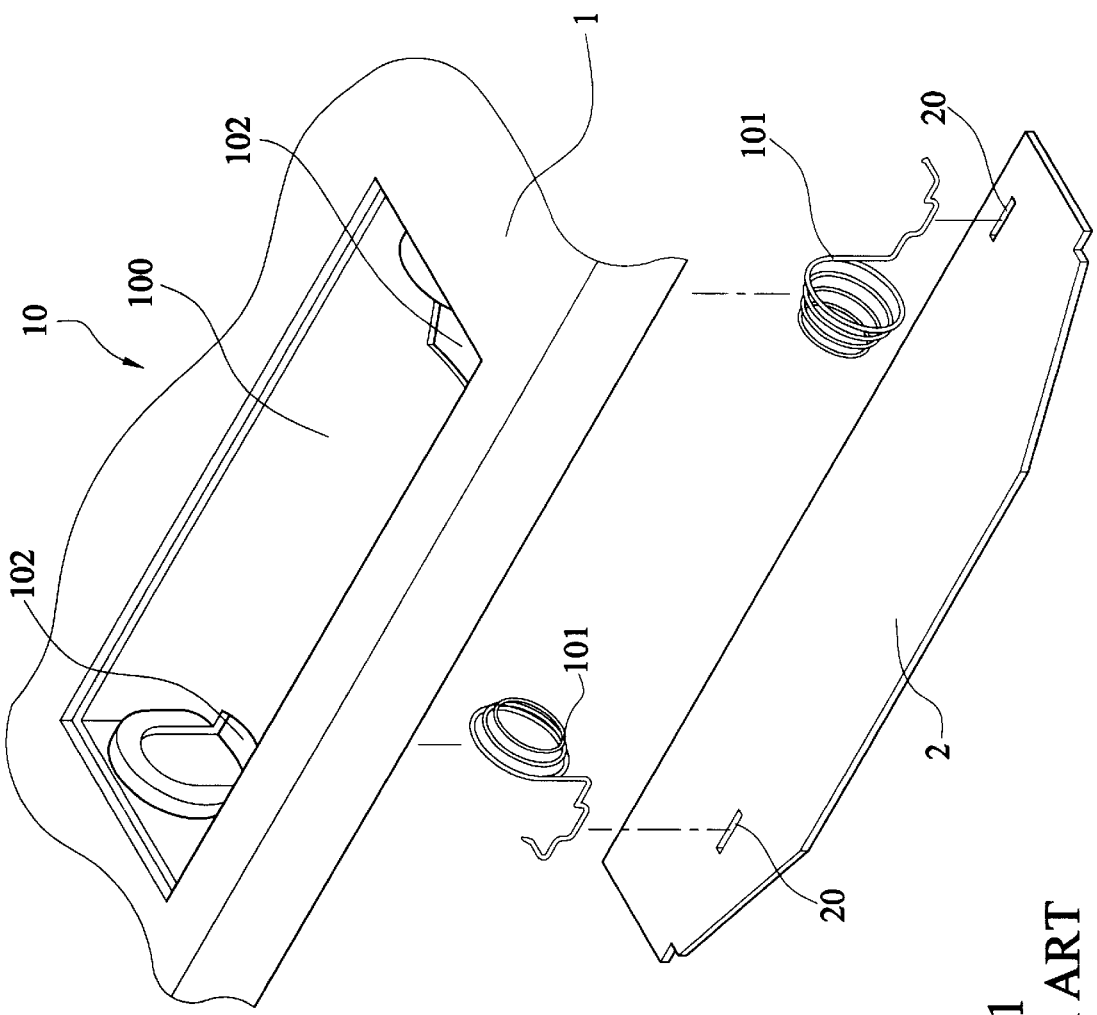
FIG. 1 is an exploded view of a prior art battery stage.
Figure 2:
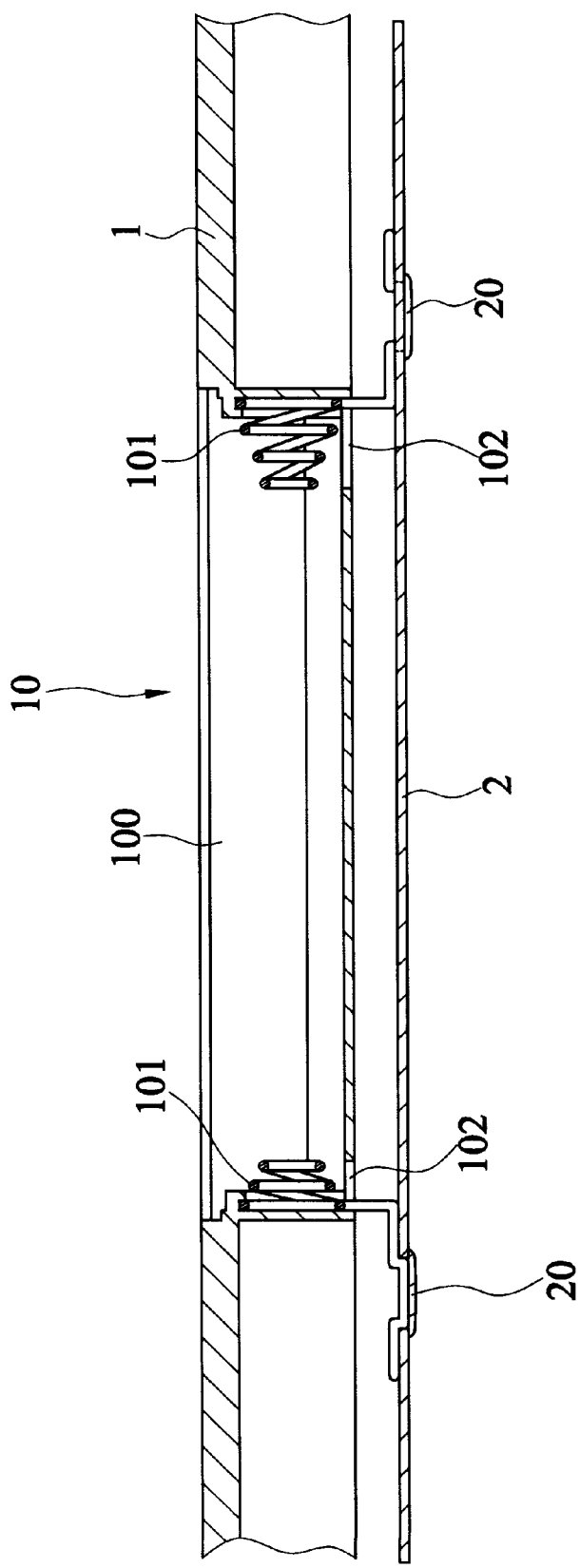
FIG. 2 is a sectional view of the prior art battery stage.
Figure 3:
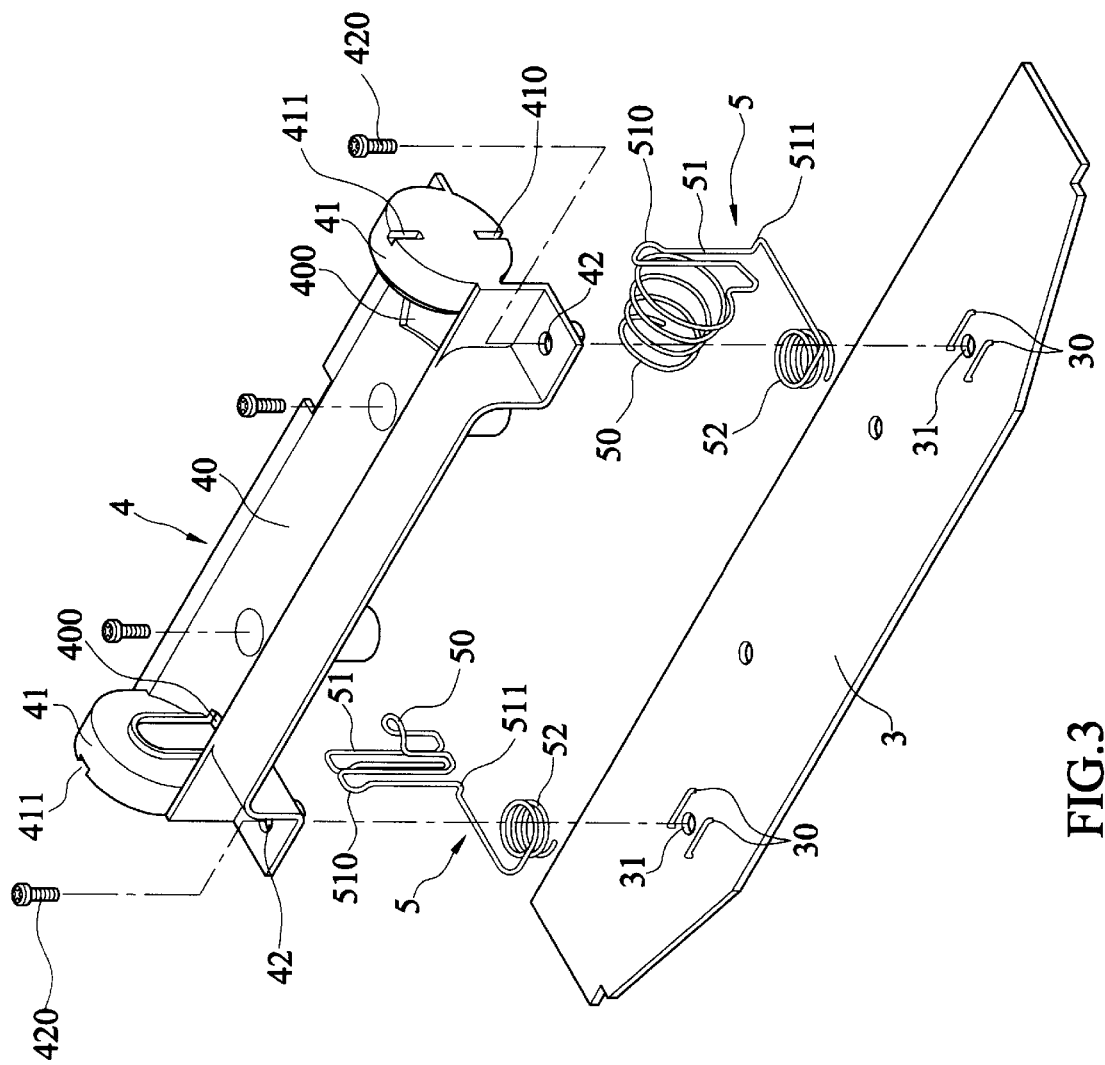
FIG. 3 is an exploded view of the present invention.
Figure 4:
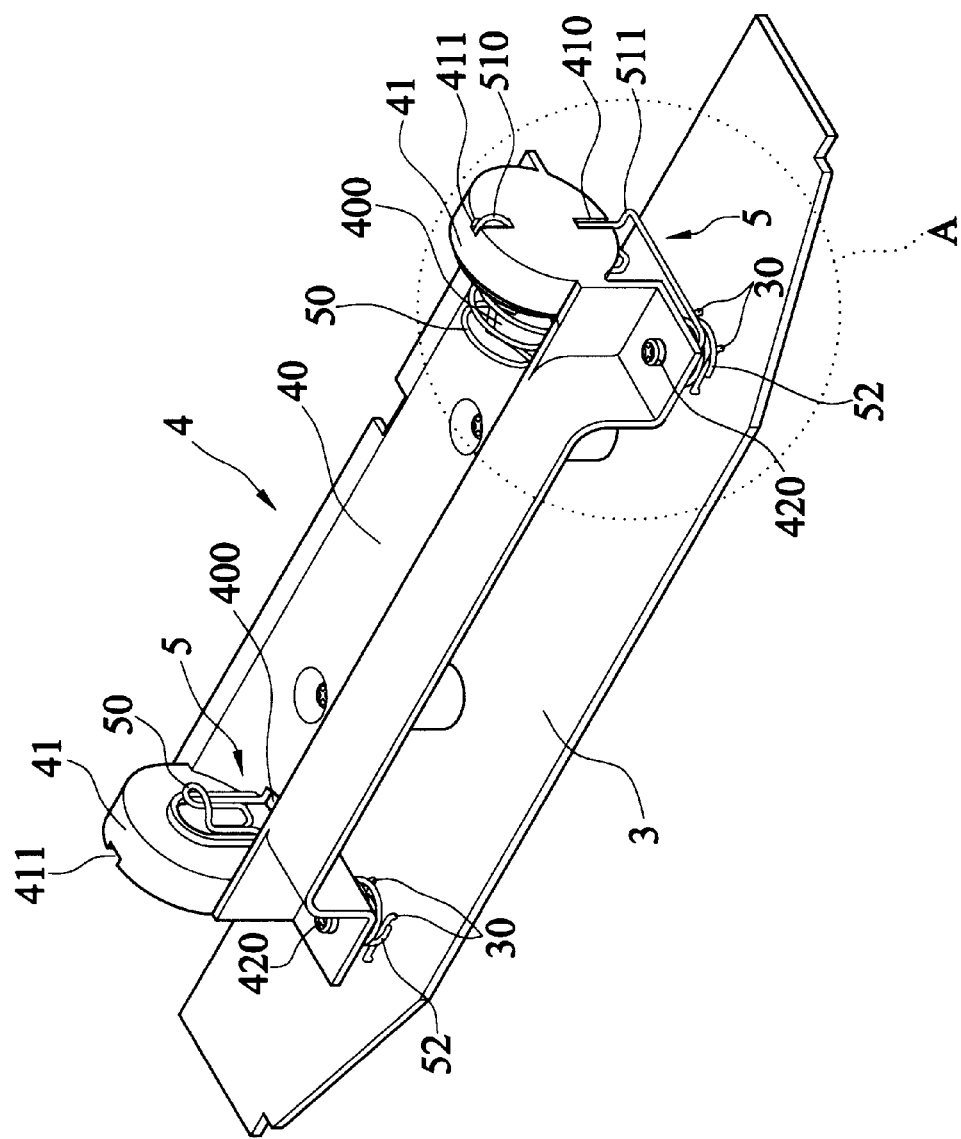
FIG. 4 is a perspective view of the present invention.

With reference now to FIGS. 3 and 4, the present invention provides a battery stage module, which is assembled on a circuit board 3 of a consumer electronic device and can be the primary or auxiliary power source of the consumer electronic device.

Figure 5:
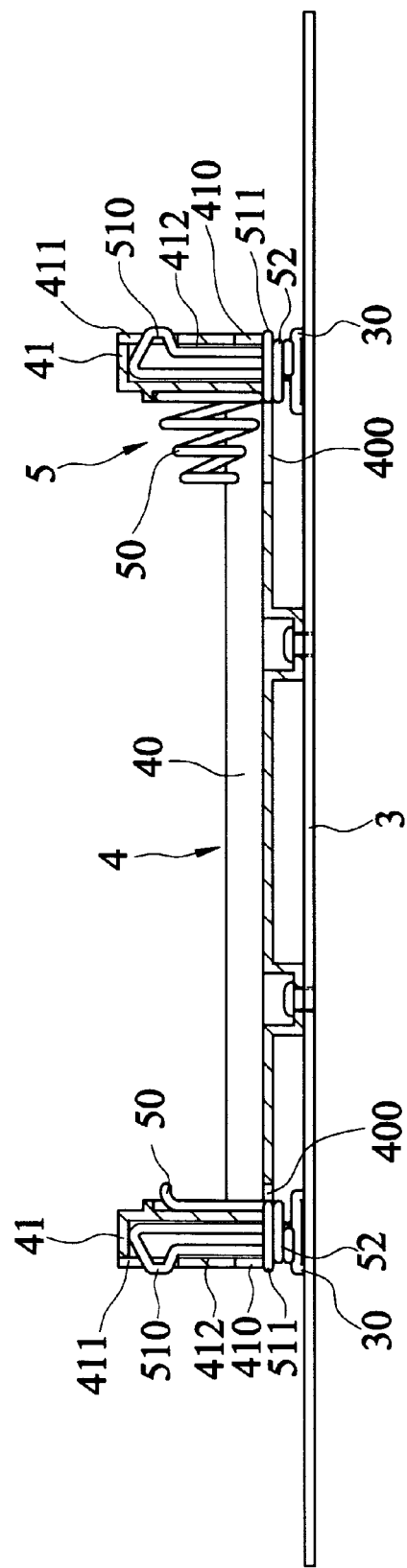
FIG. 5 is a sectional view of the present invention.

The battery stage module comprises a battery stage 4 and two conductive members 5. The battery stage 4 has a battery chamber 40 to receive battery. The battery chamber 40 has two end walls 41 and two through holes 400 on bottom thereof and beside the end walls 41. The end wall 41 has an upper slit 411 and a lower slit 410 and a groove 412 between the upper slit 411 and the lower slit 410, as shown in FIG. 5. Moreover, the battery stage 4 has a plurality of thread hole 42 at locations corresponding to thread hole 31 and jumper contacts 30 on the circuit board 3. A clamping means such as screws 420 are tighten through the thread hole 42 to clamp the battery stage 4 on the circuit board 3.

Figure 4A:
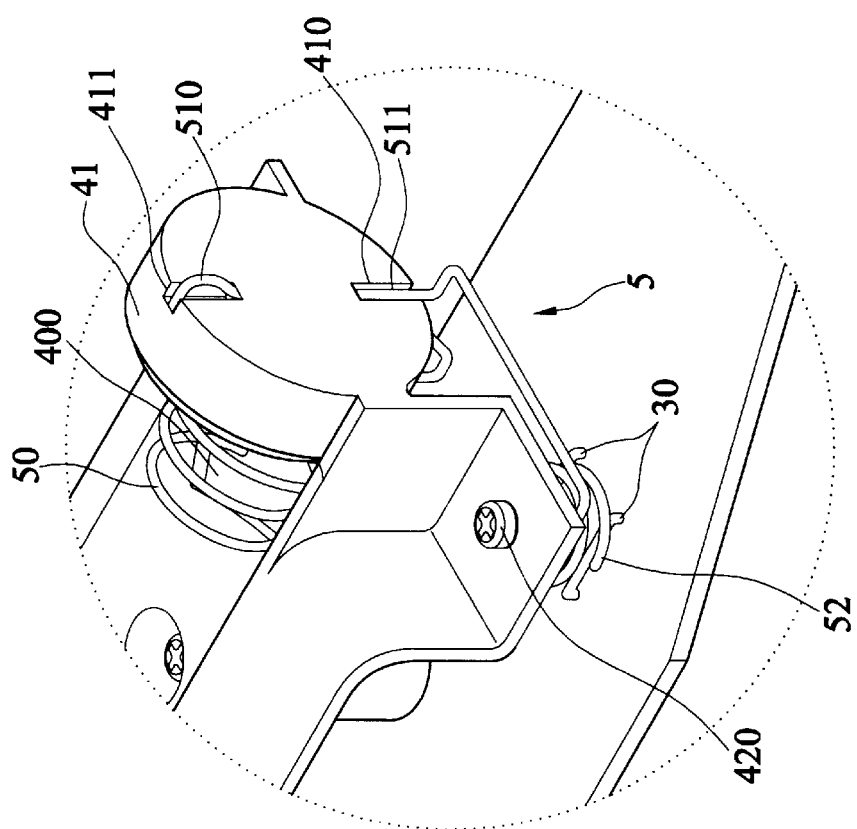
FIG. 4A is a partially enlarged view of portion A in FIG. 4.

Each conductive member 5 is formed by bending a metal wire and comprises a first spring 50, a clamping arm 51 and a second spring 52. As shown in FIGS. 4, 4A, 5, each first spring 50 passes through the through hole 400 and abuts on one end wall 41 such that the poles of the battery can be in contact with the first spring 50 when being inserted into the battery chamber 40. The clamping arm 51 is inserted into the groove 412 and an upper clamping part 510 on top of the clamping arm 51 and a lower clamping part 511 on bottom of the clamping arm 51 are engaged into the upper slit 411 and the lower slit 410, respectively. Therefore, the second spring 52 is fixed to the bottom of the thread hole 42 and is penetrated by the screw 420.

The above-mentioned battery stage 4 can be individually prepared and easily assembled on the circuit board 3 by screw 420. In other word, the operator tights the screw 420 into the thread hole 31 between the jumper contacts 30 to lock the battery stage 4 on the circuit board 3. More particularly, the second spring 52 is forced to touch the jumper contacts 30 during the tightening procedure.

In other word, after preparing the battery stage 4 in modular fashion, both the battery stage 4 and the conductive member 5 can be assembled on the circuit board 3 by simply tightening the screw 420. The cumbersome, reflow soldering and wiring are omitted. The second spring 52 of the conductive member 5 can be firmly assembled to the jumper contacts 30 by the tightening of the screw 420. The second spring 52 is penetrated and retained by the screw 420, therefore, the second spring 52 will not drop from the battery stage module.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A battery stage module arranged on a circuit board and adapted for consumer electronic devices; the battery stage module comprising:

a battery stage having a battery chamber for receiving a battery;

two clamping means arranged on the battery stage, each of said clamping means adjacent two jumper contacts on the circuit board; the clamping means clamping the battery stage to the circuit board;

two conductive elements each having a first elastic part formed with a second elastic part each of the first elastic parts located at a bottom of the battery chamber and contacting respective poles of the battery each of the second elastic parts located at a bottom of the battery stage and aligned with each of the clamping means, each of the second elastic parts touching the jumper contacts on the circuit board when the clamping means clamp the battery stage on the circuit board.

2. The battery stage module as in claim 1, wherein each of the conductive elements is formed by bending a metal wire; and the first elastic part and the second elastic part of each of said conductive elements are formed as spring shape.

3. The battery stage module as in claim 1, wherein the clamping means is a screw and the battery stage and the circuit board have thread holes adapted to receive the screw.

4. The battery stage module as in claim 1, wherein the battery chamber has two end walls and has a through hole near the end wall to allow passing of the first elastic part.

5. The battery stage module as in claim 4, wherein a clamping arm is formed between each of the first and second elastic parts, the battery chamber having two grooves aligned to the clamping arm on a bottom of the end wall.

6. The battery stage module as in claim 5, wherein the clamping art has an upper clamping part extending outward and the top of the groove has an upper slit engaged with the upper clamping part.

* * * * *